United States Patent
Ganusov et al.

(10) Patent No.: US 9,577,615 B1
(45) Date of Patent: Feb. 21, 2017

(54) CIRCUITS FOR AND METHODS OF REDUCING DUTY-CYCLE DISTORTION IN AN INTEGRATED CIRCUIT IMPLEMENTING DUAL-EDGE CLOCKING

(71) Applicant: Xilinx, Inc., San Jose, CA (US)

(72) Inventors: Ilya K. Ganusov, San Jose, CA (US); Benjamin S. Devlin, San Francisco, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/792,894

(22) Filed: Jul. 7, 2015

(51) Int. Cl.
  *H03K 3/017* (2006.01)
  *H03K 3/356* (2006.01)

(52) U.S. Cl.
  CPC .............. *H03K 3/017* (2013.01); *H03K 3/356* (2013.01)

(58) Field of Classification Search
  CPC .............. H03K 5/01; H03K 5/04; H03K 5/05; H03K 5/06; H03K 5/07; H03K 5/12; H03K 5/003; H03K 5/151; H03K 7/08
  USPC ................................. 327/170, 172, 174, 175
  See application file for complete search history.

(56) References Cited

U.S. PATENT DOCUMENTS

| 7,979,827 B1 | 7/2011 | Trimberger et al. |
| 8,205,180 B1 | 6/2012 | Anderson et al. |
| 2009/0201066 A1* | 8/2009 | Do .................. G06F 1/08 327/299 |

* cited by examiner

*Primary Examiner* — John Poos
(74) *Attorney, Agent, or Firm* — John J. King; Keith Taboada; Carleton Clauss

(57) ABSTRACT

A circuit for reducing duty-cycle distortion in an integrated circuit implementing dual-edge clocking is described. The circuit also comprises a plurality of circuit elements that enable the routing of data generated at outputs of the circuit elements; a plurality of register circuits that store data at outputs of the plurality of circuit elements; a clock circuit routing a clock signal to clock inputs of the plurality of register circuits; and a pulsed-controlled register circuit coupled to an output of a circuit element and generating a pulsed output coupled to a clock input of a register of the pulse-controlled register circuit; wherein the pulsed output is coupled to the clock input of the register to enable the pulse-controlled register circuit to store data at a time that is different than an edge of the clock signal. A method of reducing duty-cycle distortion in an integrated circuit implementing dual-edge clocking is also described.

20 Claims, 12 Drawing Sheets

CIRCUITS FOR AND METHODS OF REDUCING DUTY-CYCLE DISTORTION IN AN INTEGRATED CIRCUIT IMPLEMENTING DUAL-EDGE CLOCKING

FIELD OF THE INVENTION

The present invention relates generally to integrated circuit devices, and in particular, to circuits for and methods of reducing duty-cycle distortion in an integrated circuit implementing dual-edge clocking.

BACKGROUND OF THE INVENTION

Clock networks are an important part of implementing circuits in integrated circuit devices. Significant power is consumed by routing clock signals in an integrated circuit. Further, a clock signal can be altered as it is routed in a clock network of the integrated circuit. For example, duty-cycle distortion (DCD) associated with rising and falling edges of a clock signal occurs due to the difference in rising and falling edge signal propagation in the clock network. There is generally a difference between the strength of a PMOS transistor (used for a 0 to 1 transition) and strength of an NMOS transistor (used for a 1 to 0 transition). This variation is largely due to materials used in the device and physical layout variation. Therefore, a rising edge and a falling edge that is driven from a common node will have different propagation times to the next buffer. The difference between rising and falling edge propagation will accumulate at each stage, creating distortion in the duty cycle of the clock signal.

When using both rising and falling edges to register data using a clock signal for example, there is a time penalty (either positive or negative) between consecutive rising and falling edges as a result of duty-cycle distortion. When only using one clock edge, the duty-cycle distortion can be ignored because the clocking functions are aligned with one edge. But with dual-edge clocking, duty-cycle distortion will add time to odd edge clock skew and subtract time from even edge clock skew, or vice versa, depending on rising/falling delay propagation ratio. As a result, duty-cycle distortion reduces the operating speed of the integrated circuit.

Accordingly, improved circuits for and methods of reducing duty-cycle distortion are desired.

SUMMARY OF THE INVENTION

A circuit for reducing duty-cycle distortion in an integrated circuit implementing dual-edge clocking is described. The circuit also comprises a plurality of circuit elements that enable the routing of data generated at outputs of the circuit elements; a plurality of register circuits that store data at outputs of the plurality of circuit elements; a clock circuit routing a clock signal to clock inputs of the plurality of register circuits; and a pulsed-controlled register circuit coupled to an output of a circuit element and generating a pulsed output coupled to a clock input of a register of the pulse-controlled register circuit; wherein the pulsed output is coupled to the clock input of the register to enable the pulse-controlled register circuit to store data at a time that is different than an edge of the clock signal.

A method of reducing duty-cycle distortion in an integrated circuit implementing dual-edge clocking is also described. The method comprises implementing a plurality of circuit elements to enable routing of data between the circuit elements; implementing a plurality of register circuits to store output data generated at outputs of the circuit elements; routing a clock signal to clock inputs of the plurality of register circuits; identifying duty-cycle distortion in the clock signal at a clock input of a register of a first register circuit; and coupling a pulsed output to the clock input of the register of the first register circuit; wherein the pulsed output is coupled to the clock input of the register to enable the pulse-controlled register circuit to store data at a time that is different than an edge of the clock signal.

Another circuit for reducing duty-cycle distortion in an integrated circuit implementing dual-edge clocking comprises means for routing data generated at outputs of a plurality of circuit elements; means for storing data generated at the outputs of the plurality of circuit elements at a plurality of register circuits; means for routing a clock signal to clock inputs of the plurality of register circuits; and a pulsed-controlled register means coupled to an output of a circuit element and generating a pulsed output coupled to a clock input of a register of the pulse-controlled register means; wherein the pulsed output is coupled to the clock input of the register to enable the pulse-controlled register means to store data at a time that is different than an edge of the clock signal.

Other features will be recognized from consideration of the Detailed Description and the Claims, which follow.

DETAILED DESCRIPTION

The circuits and methods set forth below reduce power consumed by routing clock signals in an integrated circuit, and mitigate the penalty due to duty-cycle distortion when using dual-edge clocking. Dual-edge clocking is used to reduce dynamic power consumed in distributing a clock signal in an integrated circuit by distributing the clock signal at half speed. Pulse-controlled registers that trigger on both rising and falling edges can be selectively implemented to reduce the impact of duty-cycle distortion. That is, a time penalty as a result of duty-cycle distortion can be reduced by ensuring that a pulse generated by a pulse-controlled register is sufficient to provide an offset for the duty-cycle distortion. By way of example, a method of mitigating the penalty due to duty-cycle distortion can include identifying duty-cycle distortion in the clock signal at a clock input of a register, and coupling a pulsed output of a pulse generator, rather than the clock signal exhibiting duty-cycle distortion, to the clock input of the register.

While the specification includes claims defining the features of one or more implementations of the invention that are regarded as novel, it is believed that the circuits and methods will be better understood from a consideration of the description in conjunction with the drawings. While various circuits and methods are disclosed, it is to be understood that the circuits and methods are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the circuits and methods.

Figure 1:
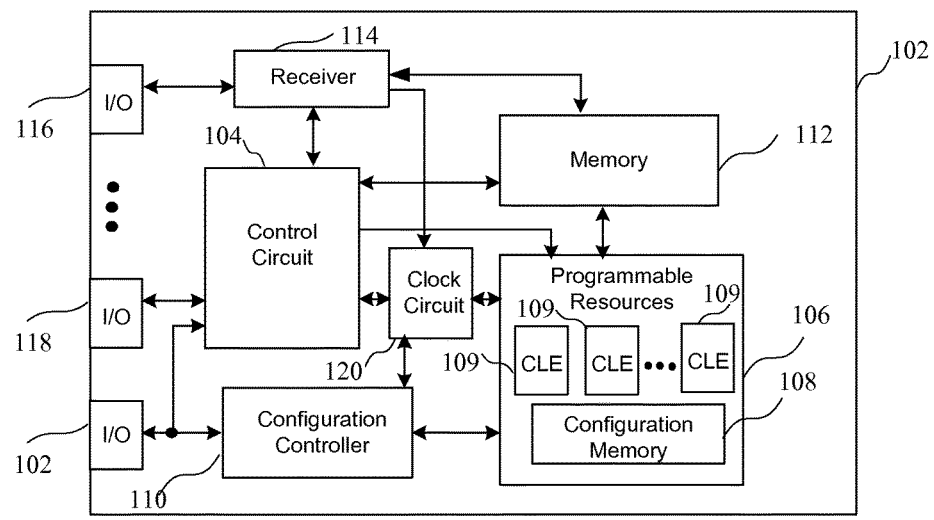
FIG. 1 is a block diagram of an integrated circuit device having programmable resources and implementing dual-edge clocking for routing data.

Turning first to FIG. 1, a block diagram of an integrated circuit device having programmable resources for routing data implementing dual-edge clocking is shown. In particular, an input/output port 102 is coupled to a control circuit 104 that controls programmable resources 106 having configuration memory 108. Configuration data may be provided to the configuration memory 108 by a configuration controller 110. The configuration data enables the operation of configurable logic elements 109. While CLEs are shown by way of example as one type of programmable resources, it should be understood that other programmable resources, such as those described in reference to FIG. 16, could be implemented. A memory 112 may be coupled to the control circuit 104 and the programmable resources 106. A receiver circuit 114 may be coupled to the control circuit 104, programmable resources 106 and the memory 112, and may receive signals external to the integrated circuit device by way of an I/O port 116. Other I/O ports may be coupled to circuits of the integrated circuit device, such as I/O port 118 that is coupled to the control circuit 104 as shown. A clock circuit 120 is coupled to various elements of the circuit of FIG. 1, and may be coupled to a clock network, such as the clock network of FIG. 3. The circuits and methods described in more detail below may be implemented by various elements of the circuit of FIG. 1. Data may be routed using programmable interconnect elements between various circuit elements such as CLE's implemented as lookup tables for example, as will described in reference to FIGS. 2 and 19-21.

Figure 2:
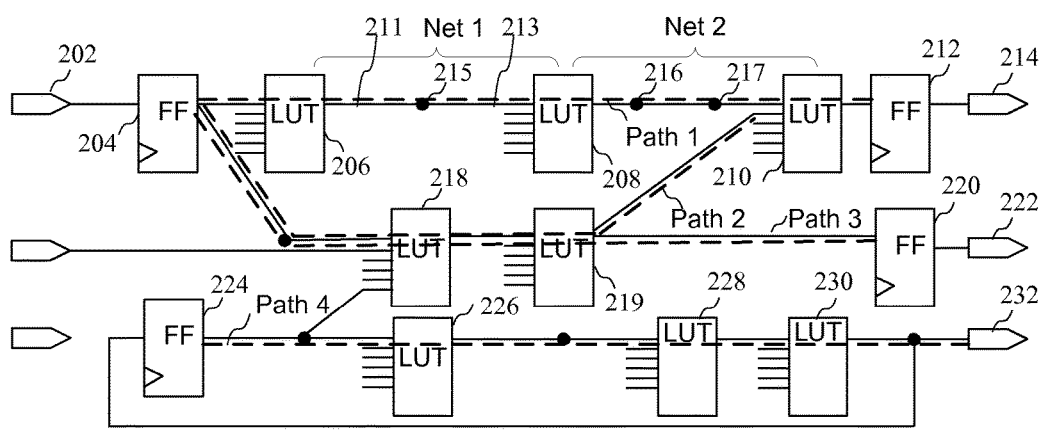
FIG. 2 is a block diagram of a circuit showing the routing of data between programmable resources in an integrated circuit.

Turning now to FIG. 2, a block diagram of a circuit shows the routing of data between programmable resources in an integrated circuit, and more particularly, an example of nets and paths in a device having programmable logic. The timing constraints in a circuit may be based upon nets or paths, for example. A net represents a collection of interconnect lines from the output of a user logic block, such as CLEs as described in FIG. 18, to inputs of the next destination block, while a path represents a sequence of nets between registers comprising a connection from a source to a specific destination. A path may be defined as a clock-to-clock path, such as one register to another register, a register to an output, an input to a register, or an input to an output, as is well known in the art.

Referring specifically to the example of FIG. 2, an input/output (I/O) port 202, which may comprise a primary input, is coupled to an input of a register 204, shown here as a flip-flop, the output of which is coupled to an input of a look up table (LUT) 206. The LUTS of FIG. 2 could be implemented by the configurable logic elements of FIG. 17, for an example. Some inputs of LUTs and FFs in FIG. 2 are shown without nets attached. These nets may connect to other nets, LUTs or FFs, but are not shown for clarity. The output of the LUT 206 is coupled to a second LUT 208, the output of which is coupled to a third LUT 210. The output of the LUT 210 is coupled to a register 212 which is coupled to an I/O port 214. I/O port 214 may comprise a primary output. By way of example, a first path extends from the register 204 to a register 212 by way of LUT 206, LUT 208, and LUT 210. Also shown by way of example, a first net (Net1) is defined between LUT 206 and LUT 208, and comprises one interconnect point 215 connecting two interconnect wire segments 211 and 213. The interconnect point may comprise a programmable interconnect point (PIP), which may be a programmable crossbar switch routing any input of a plurality of inputs to a desired output of a plurality of outputs. The interconnect wire segments and PIPs comprise programmable interconnect elements that enable the connection of LUTs and registers to implement a circuit design.

In contrast, a second net (Net2) extending from the LUT 208 to the LUT 210 comprises two interconnect points 216 and 217 connecting interconnect wire segments. As described above, the connection from the output of one LUT to the input of another LUT may be established by a number of different nets which may comprise different delays and may be selected to comprise a desired delay or meet a minimum delay.

A second path, path 2, between the register 204 and the register 212 is shown extending through LUTs 218 and 219, and back to LUT 210. A third path extends from register 204 through LUTs 218 and 219 to register 220, the output of which is coupled to an I/O port 222. The output of a register 224 is coupled by way of LUTs 226-230 to an I/O port 232, as shown by path 4. A feedback loop is also shown, which would be considered a separate path. Interconnect multiplexers may be used to provide input flexibility between a general interconnect structure and configurable logic elements in FIG. 2 and enable adjusting nets to meet a timing constraints. The LUTs and registers of FIG. 2, as well as described in FIG. 4 below, can be implemented as parts of CLEs as described in reference to FIG. 17. The example of FIG. 2 is merely provided by way of example to show nets and paths in programmable resources of a programmable logic device. However, it should be understood that the nets may include many additional interconnect segments and interconnect points, while the paths may include many additional LUTs and registers. As should be apparent from FIG. 2, paths selected by placement and routing circuits will affect the timing of data to various registers. As will be described in reference to FIG. 3, a clock signal is routed to enable the registering of data at various locations. Depending upon the timing of data routed through various paths, certain paths may become critical timing paths, and duty-cycle distortion may make the timing in that critical path not feasible.

Figure 3:
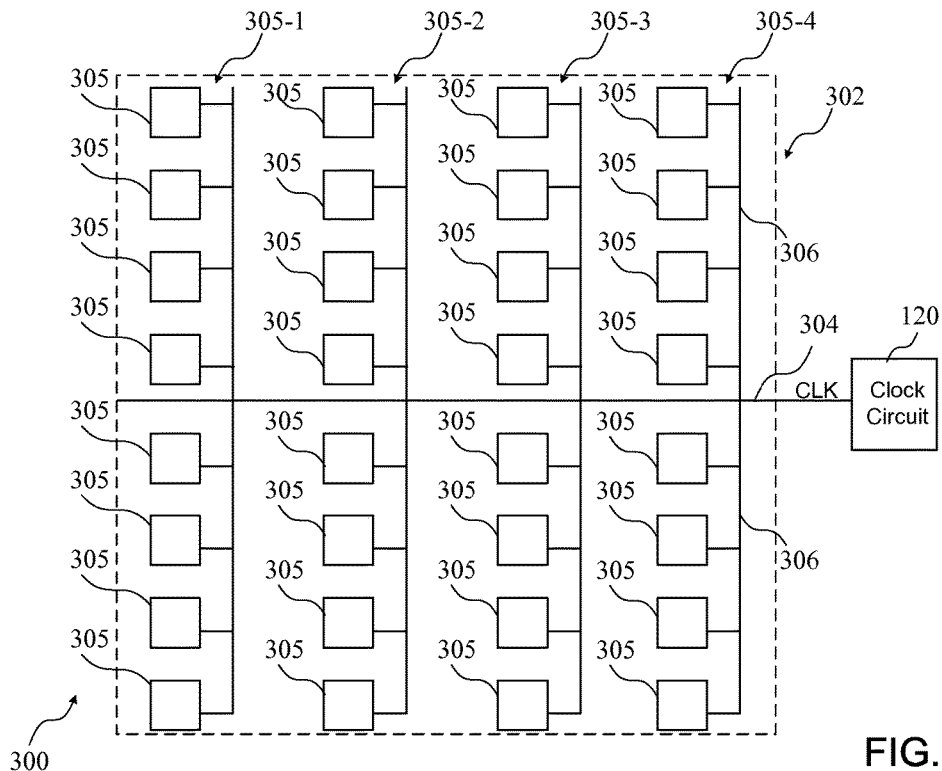
FIG. 3 is a block diagram of a clock network in an integrated circuit.

Turning now to FIG. 3, a block diagram of a clock network 300 in an integrated circuit is shown. The block diagram of a clock region 302 of the clocking network 300 in a device having programmable resources includes a clock tree that routes clock signals, such as the CLK signal generated by the clock circuit 120. As shown, the clock signal (CLK) first enters the region on one side and travels along a horizontal clock row 304. At the intersection of each column of circuit blocks 305, which may be CLEs shown here in columns 305-1 through 305-4, the clock may be connected using a plurality of vertical clock branches 306 traveling either up and/or down from the horizontal clock row and spanning half of the height of the clock region. Data signals must generally be available at the input of a memory element (such as a memory element functioning as a register of a CLE as shown in FIG. 21), before the clock signal arrives at the memory element. Therefore, taking duty-cycle distortion into account is an important aspect of correctly determining whether a pulse-controlled register should be implemented at a certain location. While clock conversion circuits for enabling dual-edge clocking can be implemented in circuit block 305, pulse-controlled registers that reduce the impact of duty-cycle distortion may be implemented at pre-determined locations, as will be described in more detail below. As is apparent in the routing structure of FIG. 3, clock signals routed on the clock tree will exhibit skew, and therefore must also be taken into account. For example, a clock signal transition will generally arrive at a flip-flop closer to a horizontal clock row than a flip-flop farther from the horizontal clock row. However, the timing of the routing of clock signals to flip-flops would depend on detailed device characterization data. As will be described in more detail below, the timing requirements for data routed in various circuit elements will determine whether a certain path is a critical path, and therefore whether a pulse-controlled register should be implemented to store data output by a circuit element.

Because duty-cycle distortion is mostly created in the clock routing and distribution, it may be necessary to distribute a normal-frequency clock (i.e. a half-frequency clock) in a conventional clock network, and only change to a dual-edge clock (i.e. a full frequency clock) at the leaf level (i.e. at the logic block 305). By selectively implementing to pulse-controlled register, it is possible implement a dual-edge clock at a leaf level for maximum power savings, which may result in extra total power savings. Further, main challenges to implementing such a data routing system include the area/power overhead of circuits that can operate on both rising and falling clock edges, as well as timing penalty introduced due to duty-cycle distortion. By selectively implementing pulse-controlled register circuits, any increase in area/power overhead is kept to a minimum while correcting duty-cycle distortion (and therefore minimizing the frequency of the clock signal). Further, because pulse generators are implemented to provide a pulse at an appropriate location to provide a fifty-percent duty-cycle of the clock signal, a half-frequency clock signal can be routed in the clock row and clock branches and data can be received at the full frequency by using both rising edges and falling edges of the clock signal, as will be described in more detail below.

Figure 4:
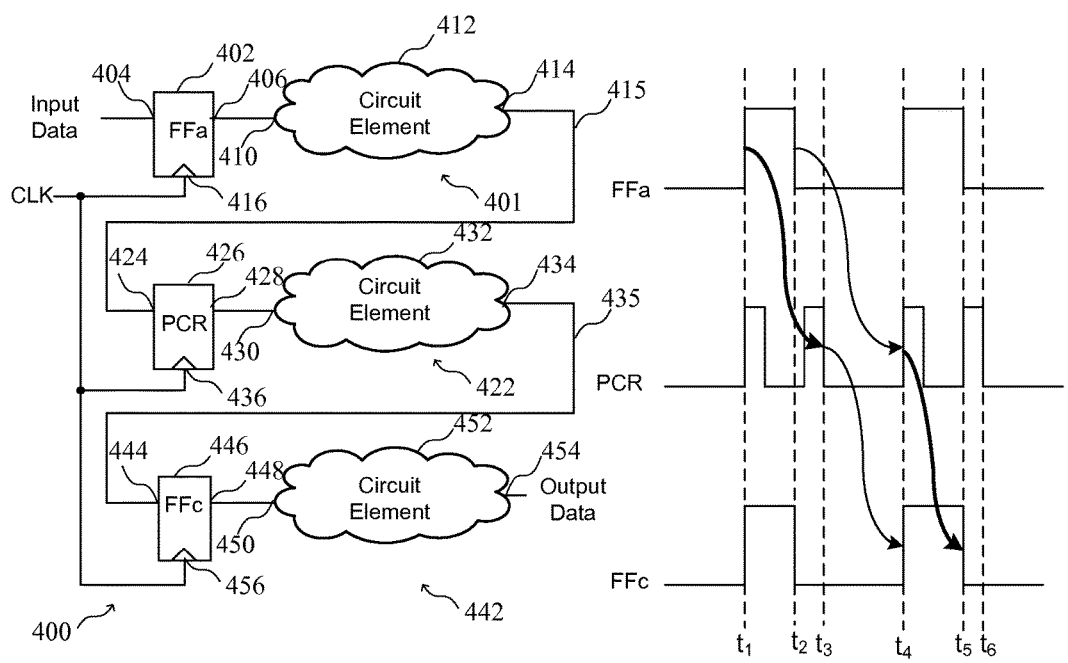
FIG. 4 is a block diagram of a circuit showing the registering of data having negative duty-cycle distortion.

Turning now to FIG. 4, a block diagram of a circuit shows the registering of data having negative duty-cycle distortion. A circuit 400 comprises a plurality of register circuits associated with circuit elements, where the register elements may receive either a clock signal or a pulse signal depending upon whether the register element is implemented as a flip-flop or a pulse-controlled register circuit. The circuit elements could use any number of LUTS coupled together by interconnect segments and interconnect points as described above in reference to FIG. 2, and a clock signal could be routed to the registers (as well as the circuit elements) as described in reference FIG. 3. A first register 402, shown here as a flip-flop, is coupled to receive input data at a data input 404. The input data could be data provided to the integrated circuit at an input/output port of the integrated circuit or could be an output of some other circuit element, including the various programmable resources described in reference to FIGS. 17 and 18. An output 406 of the first register 404 is coupled to an input 410 of a circuit element 412, which could be a LUT or a group of LUTs for example. An output 414 of the circuit element 412 of a first stage 401 of the circuit 400 is coupled to a second stage 422 by programmable interconnect elements 415 comprising a data path. That is, the output 414 is coupled to a data input 424 of a second register 426, shown here as a pulse-controlled register (PCR). The clock signal is coupled to a clock input 416. As will be described in more detail below, a particular register circuit can be implemented as a pulse-controlled register, such as a pulse-controlled latch, based upon a determination that a clock signal received at a clock input of the register circuit exhibits duty-cycle distortion. That is, rather than routing the clock signal to a register of the register circuit to store the data, a pulsed output of a pulse generator of the register circuit will be coupled to a clock input of the register to compensate for the duty-cycle distortion, and particularly a pulse-controlled register circuit is implemented in a path where the duty-cycle distortion may result in incorrect data being registered.

As will be described in more detail below in reference to FIGS. 8-13, pulse-controlled register circuits receive the clock signal and provide a pulse signal to a clock input of a register of the pulse-controlled register circuit to compensate for any duty-cycle distortion of the clock signal received at the pulse-controlled register circuit.

An output 428 of the register circuit 426 is coupled to an input 430 of the circuit element 432. An output 434 of the second stage is coupled to a third stage 442 by programmable interconnect elements 435 comprising a data path, and particularly a data input 444 of a third register 446, wherein an output 448 is coupled to an input 450 of a circuit element 452 having an output 454 for generating output data. A clock input 456 receives the clock signal. While three stages are shown by way of example, it should be understood that the arrangement of circuit elements, register circuits, and programmable interconnect elements that enable the routing of data could include many more circuit elements and register circuits. Three stages are shown to provide examples of how pulse-controlled register circuits can be selectively placed among conventional registers, such as flip-flops for example, and selectively placed at predetermined locations in critical paths determined to receive a clock signal exhibiting duty-cycle distortion.

The three timing diagrams of FIG. 4 show the clock signal used by the registers of the corresponding stages. When one clock edge is used as in a conventional approach, duty-cycle distortion can be ignored because all clocking functions are aligned with a single clock edge (i.e. rising or falling clock edge). But with dual-edge clocking, duty-cycle distortion will add time to the odd edge clock portion and subtract time from the even edge clock portion (or vice versa, depending on rising/falling delay propagation ratio). Dynamic power consumed in a clock network can be expressed by Pdynamic=$CV^2$ f, where C is the capacitance, V is the voltage, and f is the switching frequency. In conventional devices, the clock network is routed across a large network with many loads and therefore has a large capacitance, but registers operate only on one edge, where the other edge is wasted. By operating registers on both rising and falling edges, it is possible to distribute a clock at half frequency, with the data rate unaffected because the data is received in the registers at the full frequency (i.e, twice the half frequency of the routed clock signal by using both the rising and falling edges of the clock signal). Pdynamic due to clock would be reduced by half, or close to half, depending if there is any change in capacitance C. However, duty-cycle distortion will result in the selection of a clock at greater than the half speed in order to compensate for the cycle having a reduced pulse width.

The effect of duty-cycle distortion and the significance of implementing a pulse-controlled register is described in reference to the timing diagrams next to the stages of FIG. 4. The clock signal (CLK) received at the first register 402 has a rising edge at time $t_1$ and a falling edge at a time $t_2$. Because the falling edge of the clock signal coupled to the first register 402 would normally be at time $t_3$ (i.e. for a circuit not having duty-cycle distortion and therefore exhibiting a 50 percent duty cycle), the clock signal received at the first register 402 exhibits duty-cycle distortion, where the falling edge of the clock signal arrives early at time $t_2$. Because the falling edge of the clock signal is used to register data from the circuit element 412, the falling edge of the clock signal would arrive early at the input 436. Such an situation would require a slower clock to ensure that the signal to be registered by the second register 426 is received at the data input 424 at the time that the falling edge clock signal is received at the clock input 436. Therefore, rather than implementing a conventional register, such as a flip-flop, a pulse-controlled register is used, wherein the signal used to register the data is delayed by a pulse generator to generate a pulse signal having a falling edge as shown at time $t_3$ in FIG. 4. That is, without the pulse-controlled register, the falling edge of the clock signal used by the second register 426 to register the data would be at time $t_2$. By implementing the pulse-controller register circuit, the falling edge of the pulse can be selectively placed at time $t_3$ to ensure that the correct data is registered by the register 426 implemented as a latch. As will be described in more detail below, the amount of delay provided by the pulse generator to create the falling edge at the correct location can be determined through circuit simulation of a desired circuit design or through testing of fabricated integrated circuits implementing the desired circuit design.

It should be noted that the rising edge of the clock signal at time $t_4$ is at the correct time. That is, duty-cycle distortion changes the percentage of a clock signal associated with a high signal compared to a percentage of a clock signal associated with a low signal. While the period of the clock signal (i.e. between a rising edge and a rising edge for example) does not change, the portions of the period associated with the high and low signals are no longer equal. Therefore, the rising edge of the clock signal coupled to the second register 426 is received at the correct time. However, because of the duty-cycle distortion, the falling edge of the clock signal used to register the data at the output 434 of the second stage 422 by the third register 446 occurs at a time $t_5$, rather than the correct time $t_6$ if there were no duty-cycle distortion. Accordingly, a pulse-controlled register could be implemented for the third register 446. If it is determined that the path is not critical and there should be no timing issue with the data arriving in time for the correct data to be registered, a flip-flop could be implemented as register 446, as shown in FIG. 4.

Figure 5:
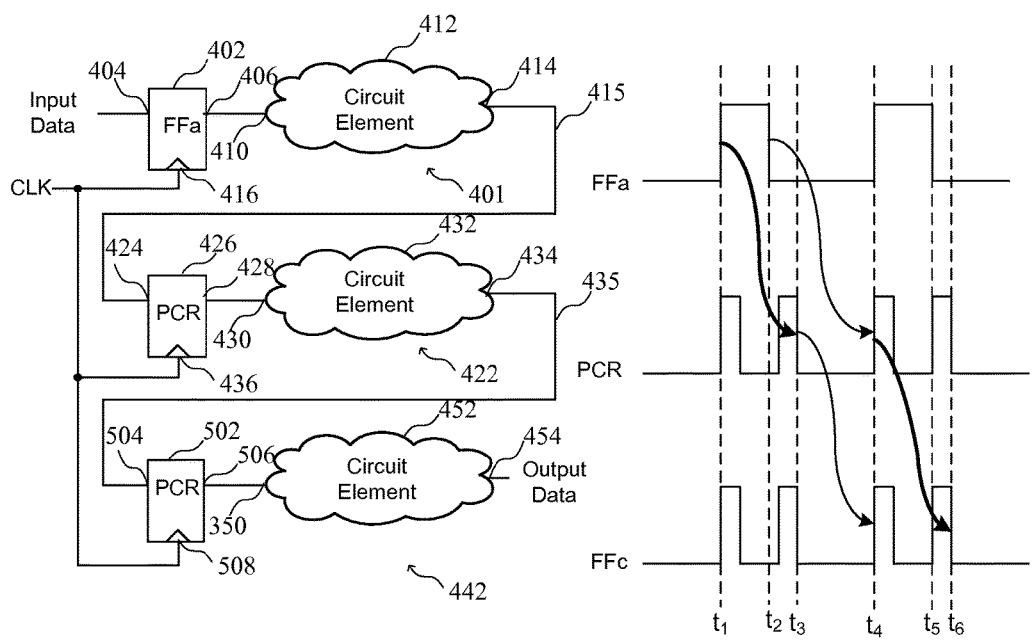
FIG. 5 is a block diagram of another circuit showing the registering of data having negative duty-cycle distortion.

However, if it is determined that the path from the second register 426 to the third register 446 is critical and that it would be necessary to compensate for the duty-cycle distortion by moving the falling edge of a clock signal, the third register 446 could be implemented as a pulse-controlled register 502. As shown in FIG. 5 the pulsecontrolled register 502 receives data at an input 504, generates output data at an output 506, and receives the clock signal at a clock input 508. Accordingly, the falling edge of the clock signal used for registering data correctly falls at time $t_6$, rather than early at time $t_5$ as shown in FIG. 5

Figure 6:
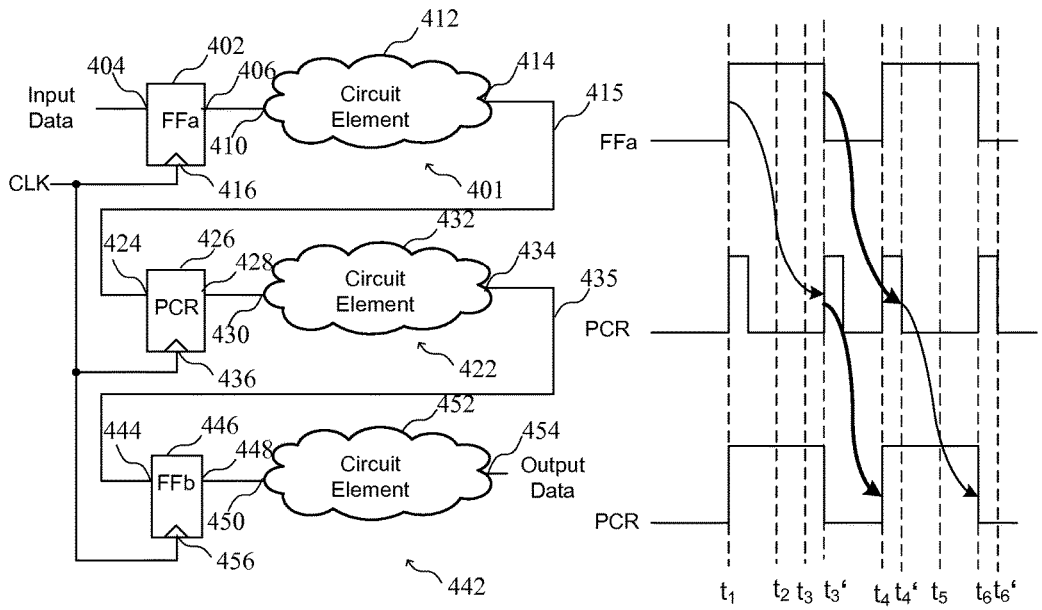
FIG. 6 is a block diagram of a circuit showing the registering of data having positive duty-cycle distortion.
Figure 7:
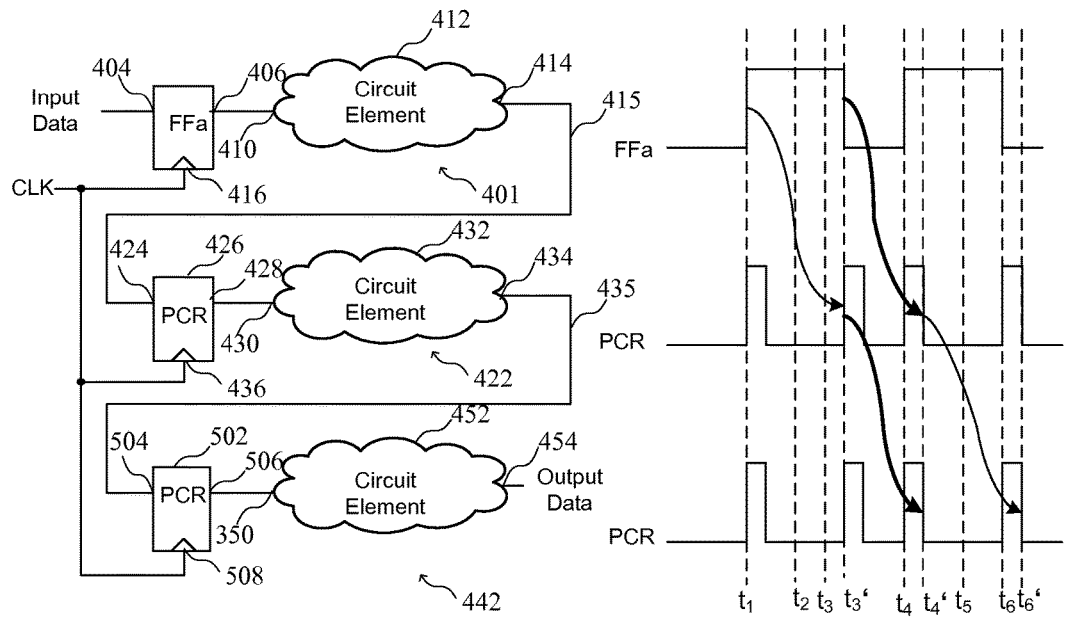
FIG. 7 is a block diagram of another circuit showing the registering of data having positive duty-cycle distortion.

FIGS. 6 and 7 show a situation where the duty-cycle distortion results in the portion of the clock signal that is high being greater than 50 percent of the clock period and the portion of the clock signal that is low being less than 50 percent of the clock period (i.e. positive duty-cycle distortion). As shown in FIG. 6, which implements a pulse-controlled register circuit for the register 426, the falling edge of the clock signal received at the register 402 occurs at a time $t_3$', after the time $t_3$ where the clock pulse would otherwise have a 50/50 duty cycle. That is, the period between the late falling edge at time $t_3$' and the rising edge at time $t_4$ is short. Therefore, the register 426 is implemented as a pulse-controlled latch to enable the falling edge of the pulse used to register data by register 426 to occur at time $t_4$'. Accordingly, the time period between time $t_3$' and time $t_4$' is one half of a clock cycle, and the correct data is received when the falling edge pulse for registering the data is received at time $t_4$'. If the path between the output of the register 426 and the data input 444 of the register 446 is a critical path and the data may not arrive at the data input 444 in time to be registered at time $t_6$, the register 446 can be implemented as a pulse-controlled register 502 as shown in FIG. 7. Accordingly, the falling edge of the pulse signal used to register the data occurs at the time $t_6$'. Therefore, as described above, pulse-controlled latches can be selectively placed, based upon timing information for data paths associated with circuit elements, to ensure that the clock signal or pulse provided by a pulse generator used to register data occurs at the correct time.

Therefore, a clock can be distributed at half frequency through the routing and distribution networks in a conventional circuit, and multiplied by 2 at the point where it enters the circuit blocks 305. Therefore, a lower rate clock (i.e. half-rate clock signal) can be routed through the clock branches 306 of FIG. 3, and the data is received at the circuit blocks 305 at a full rate by using both the rising and falling edges of the clock signal. It should be noted that the clock signal on the horizontal clock row 304 could be a full-rate clock signal that is divided at the vertical clock branches 306. A pulse-controlled register is then used with the half-rate clock signal and triggered on the rising and falling edges of the half-rate clock signal. That is, because the effects of duty cycle distortion increases the longer the half-rate clock signal is routed in the clock network, it may be beneficial to convert the half-rate clock signal farther along in the clock network. However, converting the clock signal to a half-rate clock signal farther along in the clock network is at the expense of power savings. That is, it takes more power to route the full-rate clock signal, as set forth above. For example, if the time penalty is 160 ps in the fast-min corner for an integrated circuit having 20 nanometer (20 nm) transistors, a significant performance impact degradation of approximately 7% on a 500 MHz critical path can occur. While the use of pulse-controlled register can reduce the total dynamic power savings from 4% to 3%, the DCD penalty is reduced to only 10's of picoseconds. Hold is not impacted as hold is checked off the same edge, but setup is impacted because consecutive edges have differing arrival times (i.e. odd cycles have less time and even cycles have more time). Considering a static timing analysis (STA), the worst case situation should be evaluated, where the odd cycle has reduced arrival time by a certain number "x" of picoseconds (ps). Considering a path being the worst critical path (with more delta than "x" ps to the next critical path), with clock period of 2 ns and exactly meeting requirements, an old frequency would be 1/(2*10−9)=500 Mz, with 160 ps of duty-cycle distortion, whereas a new frequency would be 1/(2.160*10−9)=463 MHz. Therefore, the new frequency has degraded 7.4% due to 160 ps of duty-cycle distortion.

In order to mitigate this degradation due to duty-cycle distortion, a subset of flip-flops is converted into pulse-controlled registers, where latches are combined with pulse generators for example. Converting to latches provides an effective solution because of the operation of the latches. That is, during the period that the clock signal is high, the latch is open, allowing the input value to propagate to the output. When the clock is low (i.e. on the falling edge of the CLK_int pulse), the output value is latched and its value is held. The data value propagating from a flip-flop (e.g. register 402) to a latch (e.g. register 426) now does not have to arrive by the edge shifted to the left by the duty-cycle distortion. Rather, it can arrive as long as the pulse generated is high, where a programmable delay allows for delay values equal to the expected value of duty-cycle distortion.

It should be noted that using pulse-controlled registers to fix duty-cycle distortion relies on different timing characteristics than conventional time borrowing. In a duty-cycle distortion situation, pulse-controlled registers enable fixing dynamic timing imbalance between odd and even cycles, while conventional time borrowing relies on static slack imbalance between sequential pipeline stages. As a result, using pulsed latches to fix duty-cycle distortion does not decrease additional performance gains possible with time borrowing.

The penalty that the circuits and methods may cause (which is true for any design using latches) is that hold time is increased by the pulse width amount, as the data value must be constant for the pulse width, rather than getting stored on the rising edge as is the case when using a flip-flop to store data. In order to evaluate the effect of the increase in hold times, a benchmark on 135 designs was run and all hold paths were made worse by 200 ps. A hold router that attempts to fix hold violations by taking longer routes was run to show that this penalty can be mitigated. Before the hold router, the average worst negative hold slack was −202 ps, and average worst negative setup slack was −967 ps. After running the hold router, the average worst negative hold slack was −5 ps, and the average worst negative setup slack was −1013 ps, or 46 ps worse, which resulting in an approximate 1% maximum frequency (Fmax) degradation on average.

Other advantages that dual-edge clocking brings, in addition to halving dynamic clock power, include reducing switching noise as a result of less IR drop on other circuits, reducing external on-board oscillator power (on the order of 100's of mW), and reducing jitter in the clock signal fed into the IC (because the external oscillator has a slower slew rate due to lower frequency). Because clock power accounts for 16% of total chip core dynamic power of an IC (which includes all programmable logic—LUTs, DSPs, BRAM, and interconnect—and excludes I/O and PS), such a power reduction of approximately half of the clock power is significant, and any additional power requirement for implementing pulse-controlled latch circuits is small compared to power reductions as a result of routing a clock signal at one-half frequency in the clocking network.

It should be noted that while the use of pulse-controlled registers increases area overhead, the increase is not significant but leads to a significant power reduction. In using a 16 nm transistor layout from a programmable delay circuit to estimate the area overhead of having a 4-inverter delay line, an XOR gate, and a 2:1 multiplexer, the pulse-controlled register circuit can generate a pulse width of 65 to 92 ps, depending on the corner (i.e. min and max). The increased area required to implement pulse-controlled register circuits in all CLE blocks (with a granularity of 4 dual-edge flip-flops per pulse generator circuit) is approximately 0.247%. This overhead would be halved if the circuit was implemented with a granularity of 8 flip-flops per pulse generator circuit.

It should be further noted that delay due to increased setup and hold of the pulse generator circuit is small. In this circuit, in the slow-max corner the clock to the output path gets additional 19 ps delay. Setup becomes 19 ps better for input to these flip-flops, but for flip-flops to other block (e.g. DSP, BRAM, etc) connections, an extra 19 ps is added to data path delay. In the fast-min corner, the clock path gets additional 14.5 ps delay and hold becomes 14.5 ps worse. Based upon these setup/hold changes in tested designs, it was determined that the impact to the overall Fmax was a 0.14% degradation.

Figure 8:
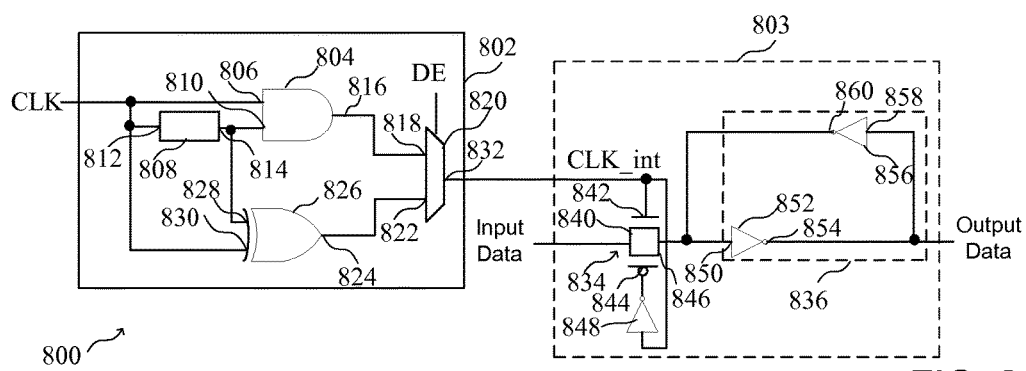
FIG. 8 is a block diagram of pulse-controlled register circuit for registering data using a latch mode.
Figure 9:
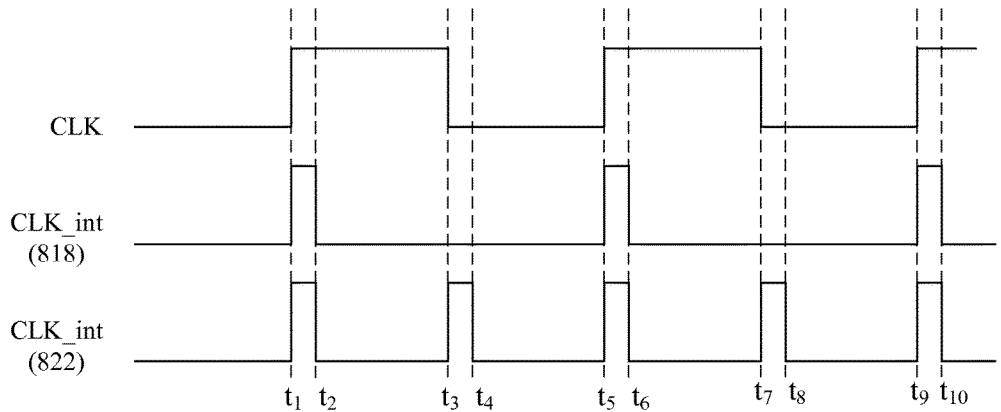
FIG. 9 is a timing diagram showing the operation of the circuit of FIG. 8.

Turning now to FIG. 8, a block diagram of a pulse-controlled register circuit 800 for registering data using a latch mode is shown. A pulse generator 802 is coupled to a latch circuit 803 comprising a register to correctly register the input data and generate output data in a circuit as described in FIGS. 4-7 for example. The pulse generator 802 comprises an AND gate 804 coupled to receive the clock signal at a first input 806, and receives a delayed clock signal generated by a delay element 808 at a second input 810. The delay circuit 808 comprises an odd number of delay elements so that the delayed clock signal generated at an output 814 is an inverted version of the clock signal. The clock signal is also coupled to an input 812 of the delay element 808, the output 814 of which is coupled to the second input 810. The AND gate 804 and the delay element 808 are provided to generate the pulse to enable latching the data provided to the latch circuit 803 based upon the dual-edge (DE) selection signal coupled to a control terminal of a selection circuit 820. An output 816 of the AND gate 804 is coupled to a first input 818 of the selection circuit 820, shown here as a multiplexer. A second input 822 of the selection circuit 820 is coupled to an output 824 of an XOR gate 826. The XOR gate is coupled to receive the delayed clock signal at the first input 828 and the clock signal at a second input 830. An output 832 of the selection circuit 820 is coupled to control the latch 803. As shown in the timing diagram of FIG. 9, the selected output signal of the pulse generator can be a pulse at each rising edge when the signal at the input 818 of the selection circuit 820 is selected, or a pulse at both the rising and falling edges when the signal at the input 822 is selected. For example, if the output signal at the input 818 is selected, a pulse is generated between times $t_1$ and $t_2$, $t_5$ and $t_6$, and $t_9$ and $t_{10}$. Pulses between times $t_3$ and $t_4$, and $t_7$ and $t_8$ will also be generated if the output signal at the input 822 is selected.

The latch 803 comprises a pass gate 834 receiving the input data, shown here by way of example as having a pair of CMOS transistors, and is controlled by the output of the selection circuit 820 at a gate 842 of the transistor 840, and by an inverted output of the selection circuit 820 at a gate 844 of a transistor 846, where the inverted output is generated by the inverter 848 and the gates 842 and 844 are clock inputs of the latch 803. The input data will be latched by the latch circuit 803 when the CLK_int pulse transitions low.

A latch element 836 is coupled to the pass gate 834, and comprises a pair of cross-coupled inverters. The input data passed by the pass gate 834 is coupled to an input 850 of an inverter 852, and output 854 of which comprises the output data and is coupled to an inverter 856 at an input 858. An output 860 of the inverter 856 is coupled to an input 850 of the inverter 852. The pulse-controlled register with optional dual-edge mode of FIG. 8 allows the latch to operate in dual-edge mode by adding an XOR gate to generate pulses on both rising and falling edges of the clock. Dynamic/static power is also reduced inside the latch because the delay line used can be shared between both the XOR and AND gates to reduce area overhead.

Figure 10:
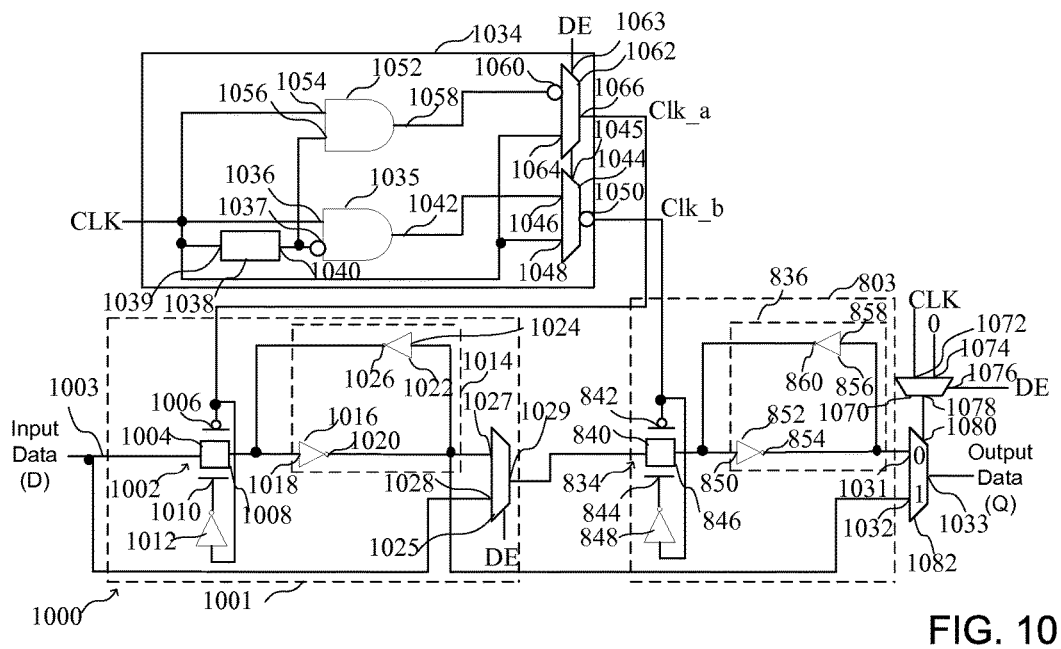
FIG. 10 is a block diagram of a pulse-controlled register circuit for registering data using a latch mode or flip-flop mode.

Turning now to FIG. 10, a block diagram of a pulse-controlled latch circuit 1000 for registering data using a dual latch mode is shown. In addition to the latch 803, which is coupled to receive a clock signal designated Clk_b, a second latch 1001 is coupled to the latch 803 and controlled by a clock signal designated Clk_a to form a flip-flop. In particular, a pass gate 1002 comprises a first transistor 1004 coupled to receive the clock signal Clk_b at a gate 1006, and a second transistor 1008 coupled to receive an inverted clock signal based upon Clk_b at a gate 1010 by way of an inverter 1012. The input data is routed to an input 1003 of the second latch 1001 comprising latch element 1014 having a pair of cross-coupled inverters. The input data passed by the pass gate 1002 is coupled to an input 1018 of an inverter 1016, and output 1020 of which is coupled to an inverter 1022 at an input 1024. An output 1026 of the inverter 1022 is coupled to the input 1018. The output 1020 is coupled to a selection circuit 1025 at first input 1027, where the input data is couple to a second input 1028. An output 1029 of the selection circuit 1025 is coupled to the pass gate 834. Output data is generated at an output 1033 of a selection circuit 1082 coupled to receive an output of the latch (i.e. output 854) circuit 803 at a first input 1031 and an output of the latch circuit 1001 at an input 1032.

The pass gates 1002 and 834 are controlled by a control circuit 1034 having an AND gate 1035 coupled to receive the clock signal at an input 1036 and a delayed clock signal at an inverted input 1037 by way of a delay element 1038 receiving the clock signal at an input 1039 and generating the delayed clock signal at an output 1040. An output 1042 of the AND gate 1035 is coupled to a selection circuit 1044 at a first input 1046 and the clock signal is coupled to an input 1048. The inverted Clk_b signal is generated at an output 1050. An AND gate 1052 is coupled to receive the clock signal at an input 1054 and a delayed clock signal at an input 1056. An output 1058 is coupled to an inverted input 1060 of a selection circuit 1062. The clock signal is also coupled to an input 1064, where the Clk_a signal is generated at an output 1066. The selection circuits 1044 and 1062 are controlled by the DE signal at control inputs 1045 and 1063, respectively. As shown in the timing diagram of FIG. 11, the Clk_a and Clk_b signals are inverted clock pulses generated on the rising and falling edges, respectively, of the clock pulse when in the dual-edge (DE) mode, and correspond to the clock signal and inverted clock signal, respectively when not in the DE mode.

The flip-flop circuit of FIG. 10 with dual-latch mode is a programmable latch circuit that allows for the input to be directly connected to the slave latch (i.e. latch circuit 803), so it can operate like a latch, but with the option for it to still be used as a flip-flop. That is, the circuit of FIG. 10 can be implemented to function as a flip-flop, or pass the data through the latch 1001 and operate latch circuit 803 as a pulse-controlled latch. As selection circuit 1070 is coupled to receive the clock signal at a first input 1072 and logical "0" at an input 1074. The logical zero is selected by the DE signal to select the first input 1031 as the output data. That is, during normal operation of the circuit of FIG. 10, the output of the latch circuit 803 will always be select as the output data, and the circuit of FIG. 10 will operate as a flip-flop. When dual-edge operation is selected, the clock signal at the input 1072 is selected, and therefore alternately selecting, using the control terminal 1076, the outputs of the latch circuit 803 and the latch circuit 1001 as the output data at an output 1078 which is coupled to the control terminal 1080 of the selection circuit 1082.

Figure 11:
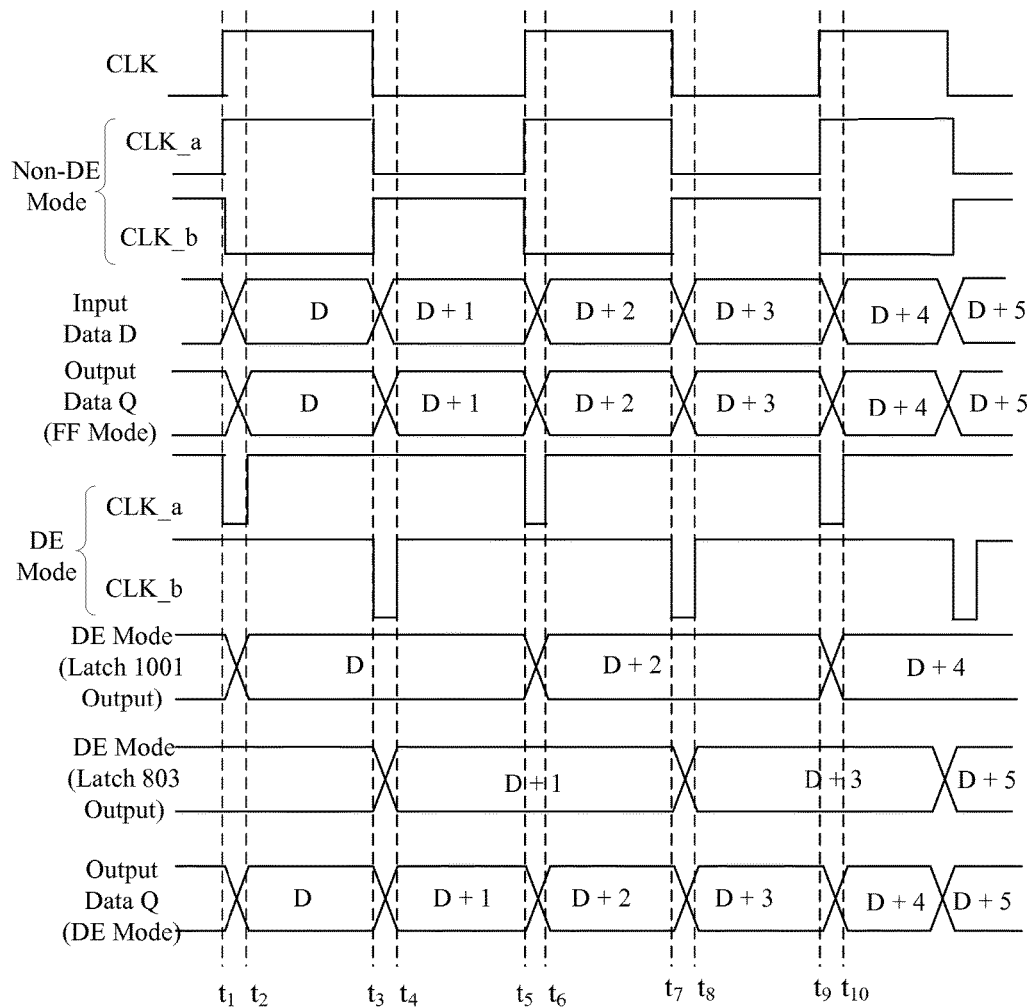
FIG. 11 is a timing diagram showing the operation of the circuit of FIG. 10.

The circuit of FIG. 10 can also be programmed to be used as two individual latches by providing a separate output pin between the two latches. When the dual-edge (DE) mode is enabled by selecting the pulsed outputs for CLK_a and CLK_b, a single flip-flop is used as if it were 2 latches, but only storing 1 bit of data in each latch per clock pulse. The left/right side of the flip-flop that is written to depends on the rising/falling edge of the clock, so it operates like a latch and can be used to help correct DCD. If DE mode is disabled and the CLK and inverted CLK signals are selected for CLK_a and CLK_b, respectively, then the circuit of FIG. 10 operates as a flip-flop. Accordingly, the circuit of FIG. 10 allows with minimal change to implement either a flip-flop or a latch, but has the benefit of implementing 2 latches. As shown in FIG. 11, the data can be received at twice the clock rate in the flip-flop mode, or two data streams (at the outputs of latches 803 and 1001) can be received at the clock rate in the DE mode by switching between the outputs of the latches 803 and 1001.

Figure 12:
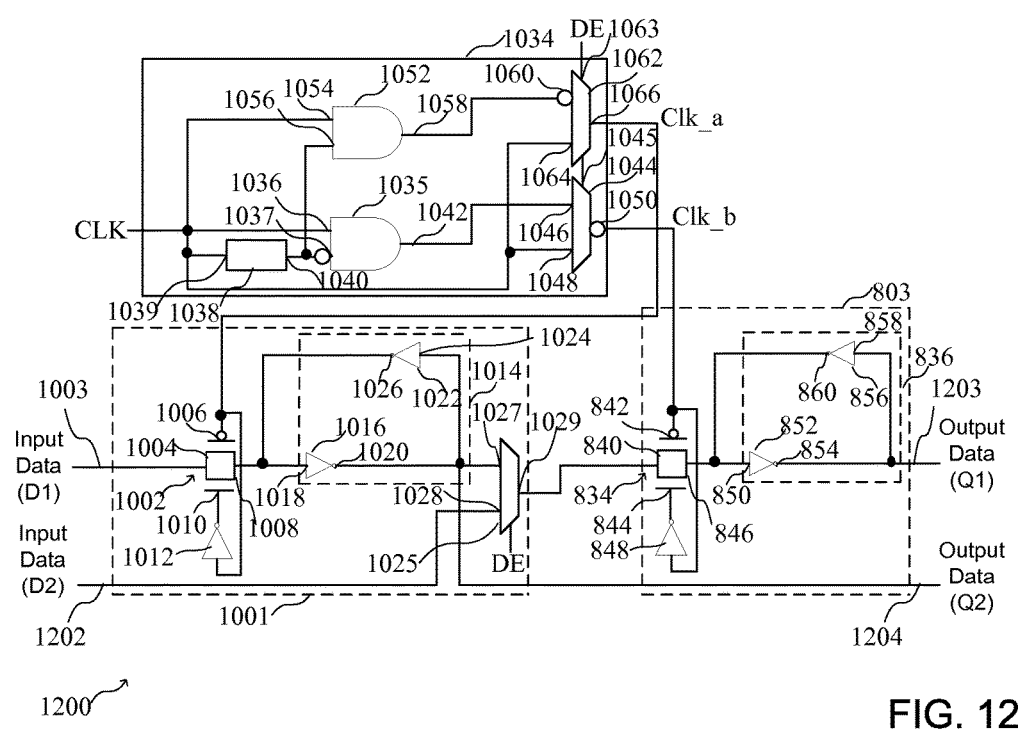
FIG. 12 is a block diagram of another pulse-controlled register circuit for registering data using a latch mode or a flip-flop mode.
Figure 13:
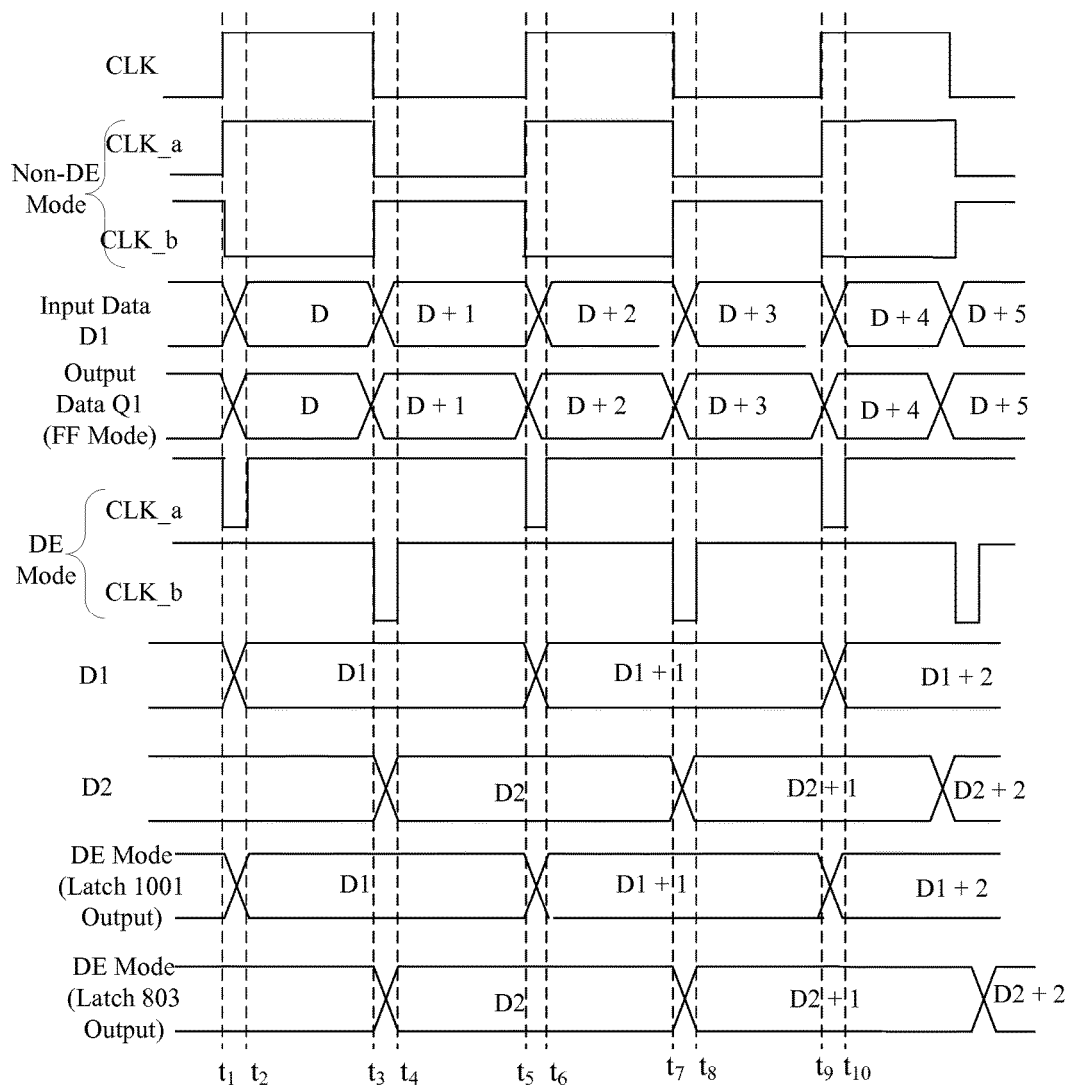
FIG. 13 is a timing diagram showing the operation of the circuit of FIG. 12.

The pulse-controlled register circuit 1200 of FIG. 12 is another programmable latch and enables the independent use of the two latches of the flip flop by providing separate inputs and outputs to the two latches. In particular, an input 1202 is provide to the input 1028 of the selection circuit 1025. When DE is enabled in the circuit of FIG. 12 with separate inputs and outputs, the flip flop can be used as 2 latches, and store 2 different data values on the rising and falling edges. When DE is disabled, the circuit is used as a flip flop (where the Q2 output is ignored). Therefore, the circuit provides the benefit of pulse-latch operation for helping DCD by enabling storing data from 2 locations (odd and even cycles of the clock take input from D1 or D2), and enabling reverting to flip-flop operation. The circuit of FIG. 12 is beneficial in the case of interleaving data on odd and even clock cycles because it is easy to merge or split data using this circuit. As shown in FIG. 13, the input data can be received at twice the clock rate in the flip-flop mode, or two separate data streams can be independently received at the clock rate by using separate inputs (i.e. 1003 and 1202) and outputs (i.e. 1203 and 1204) for the two latches 803 and 1001.

Figure 14:
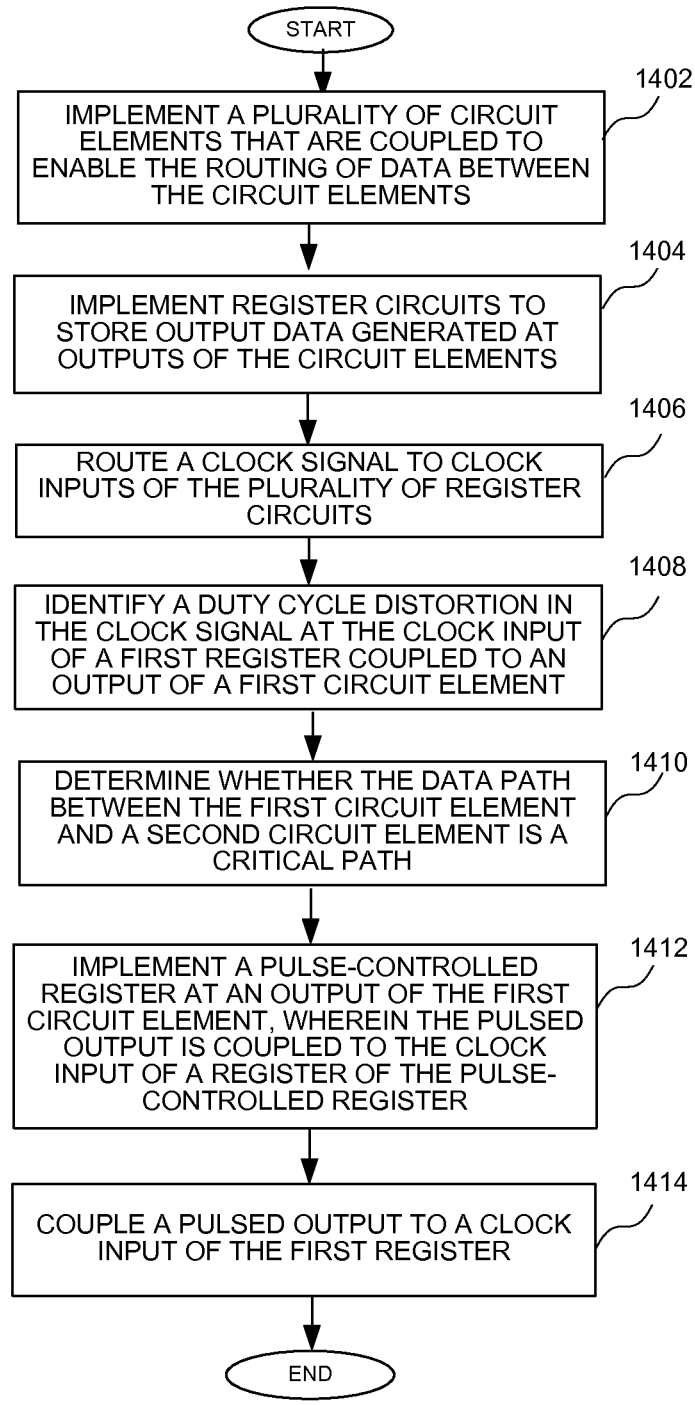
FIG. 14 is a flow chart showing a method of reducing duty-cycle distortion in an integrated circuit device implementing dual-edge clocking.

Turning now to FIG. 14, a flow chart shows a method of reducing duty-cycle distortion in an integrated circuit device implementing dual-edge clocking. In particular, a plurality of circuit elements that are coupled to enable the routing of data between the circuit elements are implemented at a block 1402. The circuit elements could be any type of circuit elements, including the CLEs described in FIGS. 1-2 and in detail in reference to FIG. 18 where the register are implemented in the CLEs. Register circuits to store output data generated at outputs of the circuit elements are implemented at a block 1404. A clock signal is routed to clock inputs of the plurality of register circuits at a block 1406.

A duty-cycle distortion in the clock signal at the clock input of a first register coupled to an output of the first circuit element is identified at a block 1408. It is then determined whether the data path between the first circuit element and the second circuit element is a critical path at a block 1410. A pulse-controlled register is implemented at an output of a first circuit element at a block 1412, wherein the pulsed output is coupled to the clock input of a register of the pulse-controlled register. The pulse-controlled registers can be implemented according to the circuits of FIGS. 8-10, for example, or with other suitable circuits. A pulsed output is coupled to a clock input of the first register of the register circuit at a block 1414. While the method of FIG. 14 shows the placement of a single pulse-controlled register, it should be understood that registers at predetermined locations can be implemented as pulse-controlled registers based upon the detection of duty-cycle distortion, where the duty-cycle distortion may affect the operation of the circuit and the pulse-controlled register would improve performance.

Figure 15:
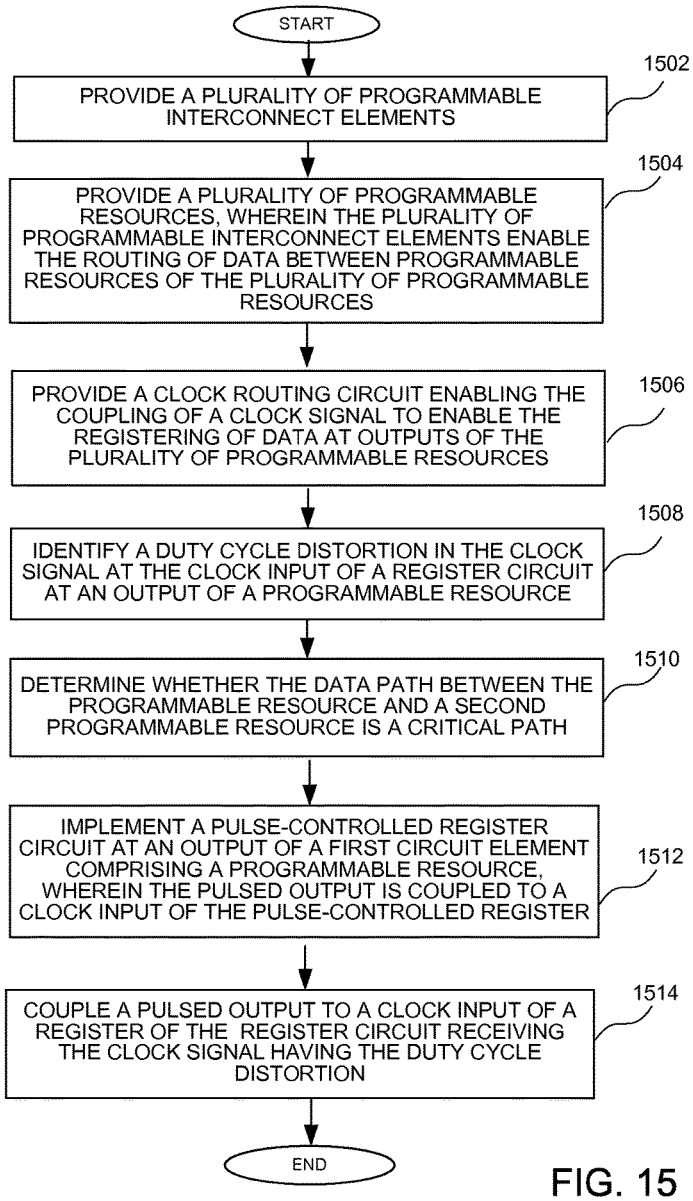
FIG. 15 is a flow chart showing another method of reducing duty-cycle distortion in an integrated circuit device implementing dual-edge clocking.

Turning now to FIG. 15, a flow chart shows another method of reducing duty-cycle distortion in an integrated circuit device implementing dual-edge clocking. A plurality of programmable interconnect elements are provided at a block 1502. A plurality of programmable resources are provided at a block 1504, wherein the plurality of programmable interconnect elements enable the routing of data between programmable resources of the plurality of programmable resources. Examples of programmable resources and the coupling of programmable resources can be found in detail in reference to FIGS. 17-18. A clock routing circuit enabling the coupling of a clock signal to enable the registering of data at outputs of the plurality of programmable resources are provided at a block 1506. The clock routing circuit could be implemented as shown in FIG. 3.

A duty-cycle distortion in the clock signal at the clock input of a register circuit at an output of a programmable resource is identified at a block 1508. It is determined whether a data path between the first programmable resource and a second programmable resource is a critical path at a block 1510. A pulse-controlled register circuit at an output of a first programmable resource is implemented at a block 1512, wherein the pulsed output is coupled to a clock input of a register of the pulse-controlled register. Examples of pulse-controlled register circuits can be found and described in detail in reference to FIGS. 8-12. A pulsed output is coupled to a clock input of a register circuit receiving the clock signal having the duty-cycle distortion at a block 1514.

According, the methods of FIGS. 14 and 15 enable compensating for duty-cycle distortion as described in reference to FIGS. 4 and 7.

The various elements of the methods of FIGS. 14 and 15 may be implemented using the circuits of FIGS. 1-13 and 16-18 as described, or using some other suitable circuits. While specific elements of the method are described, it should be understood that additional elements of the method, or additional details related to the elements, could be implemented according to the disclosure of FIGS. 1-13 and 16-18.

Figure 16:
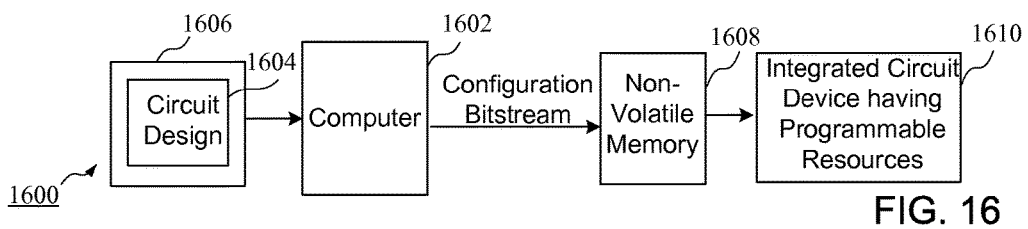
FIG. 16 is a block diagram of a system for programming a device having programmable resources.

Turning now to FIG. 16, a block diagram of a system for programming a device having programmable resources according to an embodiment is shown. In particular, a computer 1602 is coupled to receive a circuit design 1604 from a memory 1606, and generates a configuration bitstream that is stored in the non-volatile memory 1606. As will be described in more detail below, the circuit design may be a high level design, such as a circuit design defined in a hardware description language (HDL). Also, the computer may be configured to run software that generates a configuration bitstream that is stored in the non-volatile memory 1508 and provided to an integrated circuit 1610 that may be a programmable integrated circuit, such as the integrated circuit described below in FIG. 17. As will be described in more detail below, bit of the configuration bitstream are used to configure programmable resources of the integrated circuit.

Figure 17:
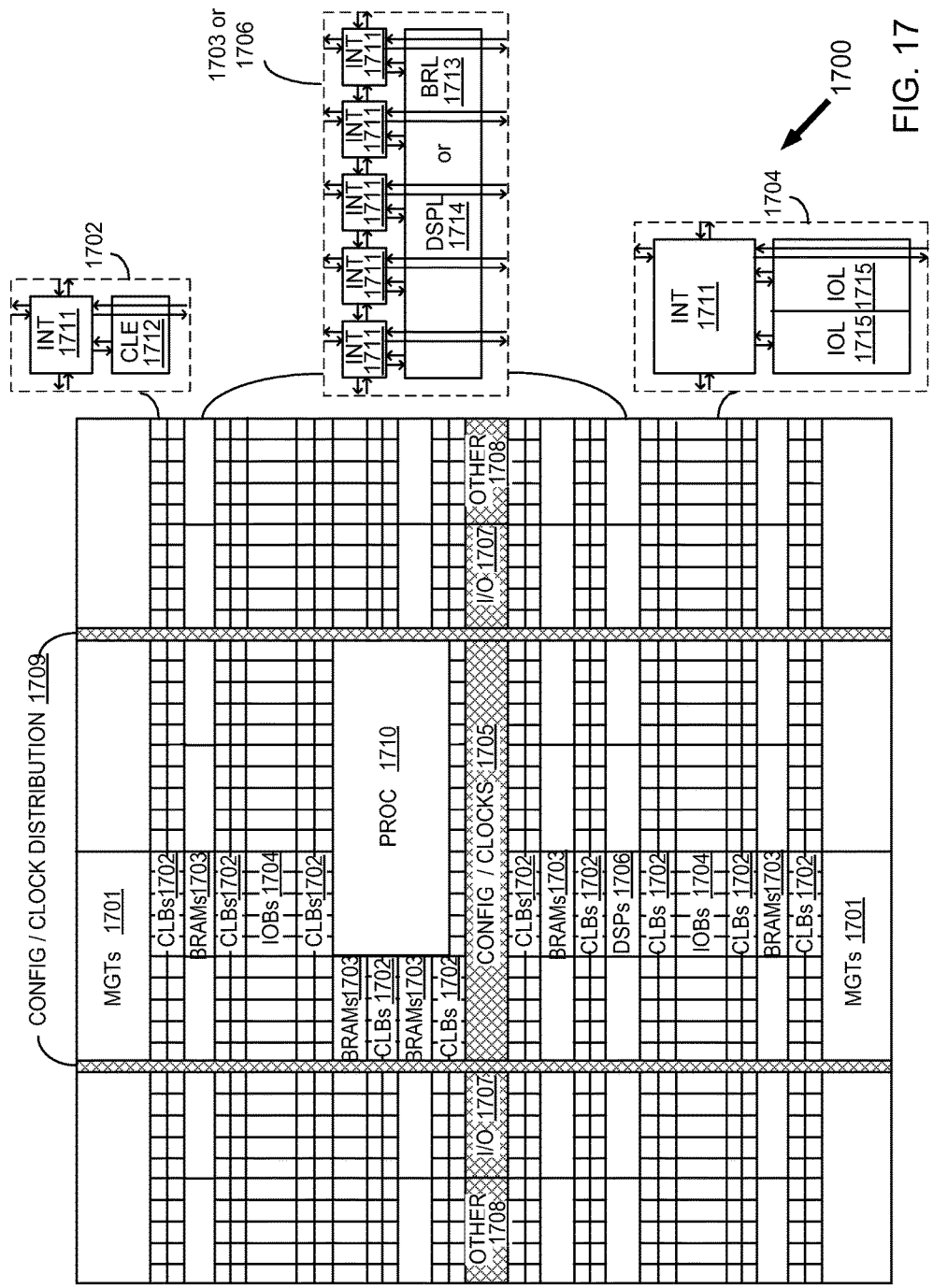
FIG. 17 is a block diagram of a device having programmable resources.

Turning now to FIG. 17, a block diagram of a device having programmable resources including the circuits of FIGS. 1-12 is shown. While devices having programmable resources may be implemented in any type of integrated circuit device, such as an application specific integrated circuit (ASIC) having programmable resources, other devices comprise dedicated programmable logic devices (PLDs). One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., Flash memory, as in some CPLDs), or in any other type of memory cell.

The device of FIG. 17 comprises an FPGA architecture 1700 having a large number of different programmable tiles including multi-gigabit transceivers (MGTs) 1701, CLBs 1702, random access memory blocks (BRAMs) 1703, input/output blocks (IOBs) 1704, configuration and clocking logic (CONFIG/CLOCKS) 1705, digital signal processing blocks (DSPs) 1706, specialized input/output blocks (I/O) 1707 (e.g., configuration ports and clock ports), and other programmable logic 1708 such as digital clock managers, analog-to-digital converters, system monitoring logic, and so forth. Some FPGAs also include dedicated processor blocks (PROC) 1710, which may be used to implement a software application, for example.

In some FPGAs, each programmable tile includes a programmable interconnect element (INT) 1711 having standardized connections to and from a corresponding interconnect element in each adjacent tile. Therefore, the programmable interconnect elements taken together implement the programmable interconnect structure for the illustrated FPGA. The programmable interconnect element 1711 also includes the connections to and from the programmable logic element within the same tile, as shown by the examples included at the top of FIG. 17.

For example, a CLB 1702 may include a configurable logic element (CLE) 1712 that may be programmed to implement user logic plus a single programmable interconnect element 1711. A BRAM 1603 may include a BRAM logic element (BRL) 1713 in addition to one or more programmable interconnect elements. The BRAM includes dedicated memory separate from the distributed RAM of a configuration logic block. Typically, the number of interconnect elements included in a tile depends on the height of the tile. In the pictured embodiment, a BRAM tile has the same height as five CLBs, but other numbers may also be used. A DSP tile 1706 may include a DSP logic element (DSPL) 1714 in addition to an appropriate number of programmable interconnect elements. An 10B 1704 may include, for example, two instances of an input/output logic element (IOL) 1715 in addition to one instance of the programmable interconnect element 1711. The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs or the processor.

In the pictured embodiment, a columnar area near the center of the die is used for configuration, clock, and other control logic. The config/clock distribution regions 1709 extending from this column are used to distribute the clocks and configuration signals across the breadth of the FPGA. Some FPGAs utilizing the architecture illustrated in FIG. 17 include additional logic blocks that disrupt the regular columnar structure making up a large part of the FPGA. The additional logic blocks may be programmable blocks and/or dedicated logic. For example, the processor block PROC 1710 shown in FIG. 17 spans several columns of CLBs and BRAMs.

Note that FIG. 17 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 17 are purely exemplary. For example, in an actual FPGA more than one adjacent column of CLBs is typically included wherever the CLBs appear in order to facilitate the efficient implementation of user logic. While the embodiment of FIG. 17 relates to an integrated circuit having programmable resources, it should be understood that the circuits and methods set forth in more detail below could be implemented in any type of ASIC.

Figure 18:
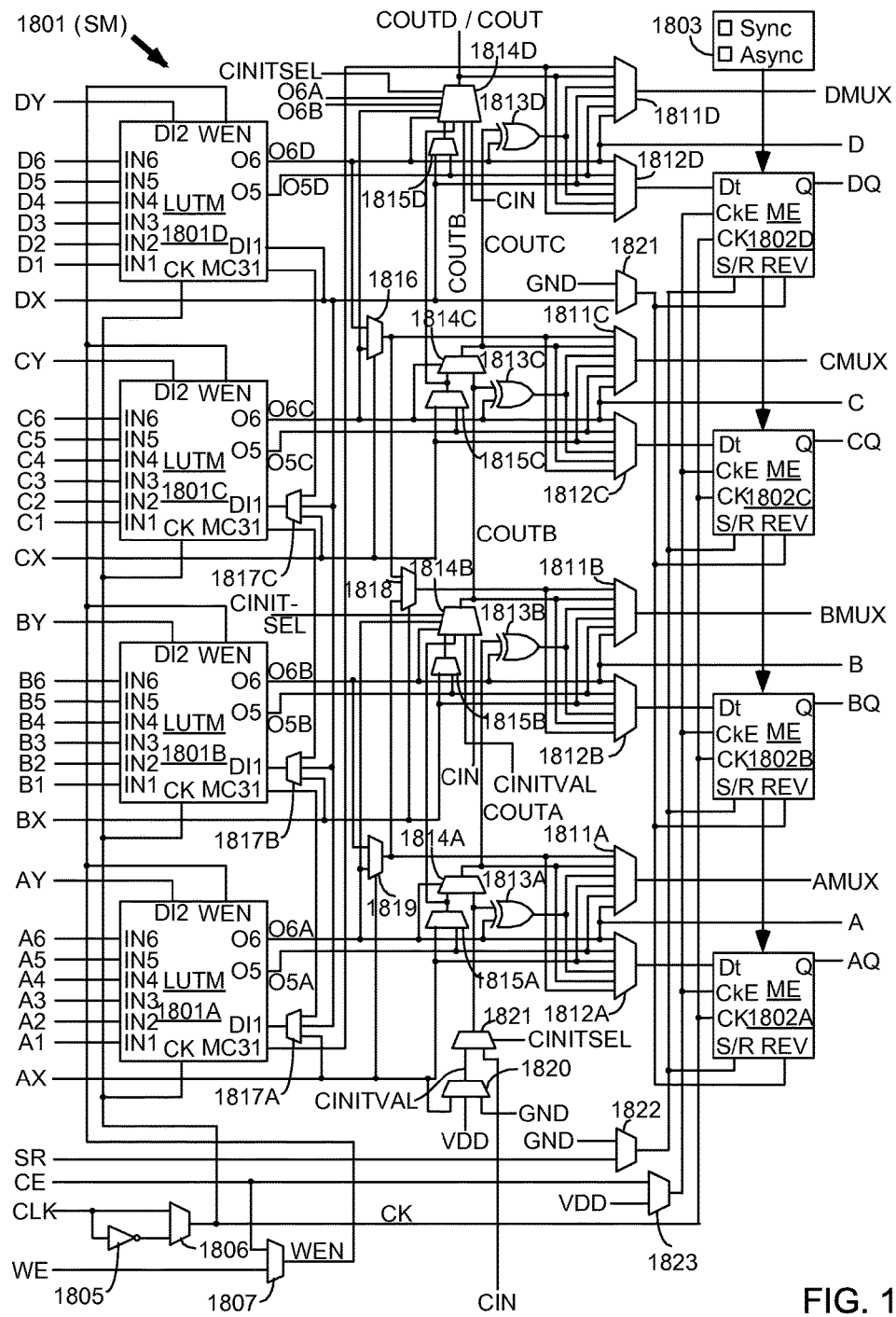
FIG. 18 is a block diagram of a configurable logic element of the device of FIG. 17.

Turning now to FIG. 18, block diagram of a configurable logic element of the device of FIG. 17 is shown. In particular, FIG. 18 illustrates in simplified form a configurable logic element of a configuration logic block 1702 of FIG. 17. In the embodiment of FIG. 18, slice M 1801 includes four lookup tables (LUTMs) 1801A-1801D, each driven by six LUT data input terminals A1-A6, B1-B6, C1-C6, and D1-D6 and each providing two LUT output signals O5 and O6. The O6 output terminals from LUTs 1801A-1801D drive slice output terminals A-D, respectively. The LUT data input signals are supplied by the FPGA interconnect structure via input multiplexers, which may be implemented by programmable interconnect element 1811, and the LUT output signals are also supplied to the interconnect structure. Slice M also includes: output select multiplexers 1811A-1811D driving output terminals AMUX-DMUX; multiplexers 1812A-1812D driving the data input terminals of memory elements 1802A-1802D; combinational multiplexers 1816, 1818, and 1819; bounce multiplexer circuits 1822-1823; a circuit represented by inverter 1805 and multiplexer 1806 (which together provide an optional inversion on the input clock path); and carry logic having multiplexers 1814A-1814D, 1815A-1815D, 1820-1821 and exclusive OR gates 1813A-1813D. All of these elements are coupled together as shown in FIG. 18. Where select inputs are not shown for the multiplexers illustrated in FIG. 18, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 18 for clarity, as well as from other selected figures herein.

In the pictured embodiment, each memory element 1802A-1802D may be programmed to function as a synchronous or asynchronous flip-flop or latch. The selection between synchronous and asynchronous functionality is made for all four memory elements in a slice by programming Sync/Asynch selection circuit 1803. When a memory element is programmed so that the S/R (set/reset) input signal provides a set function, the REV input terminal provides the reset function. When the memory element is programmed so that the S/R input signal provides a reset function, the REV input terminal provides the set function. Memory elements 1802A-1802D are clocked by a clock signal CK, which may be provided by a global clock network or by the interconnect structure, for example. Such programmable memory elements are well known in the art of FPGA design. Each memory element 1802A-1802D provides a registered output signal AQ-DQ to the interconnect structure. Because each LUT 1801A-1801D provides two output signals, O5 and O6, the LUT may be configured to function as two 5-input LUTs with five shared input signals (IN1-IN5), or as one 6-input LUT having input signals IN1-IN6.

In the embodiment of FIG. 18, each LUTM 1801A-1801D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 1817A-1817C for LUTs 1801A-1801C), or to the two 32-bit RAMs via input terminals DI1 and DI2. RAM write operations in the LUT RAMs are controlled by clock signal CK from multiplexer 1806 and by write enable signal WEN from multiplexer 1807, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 1801A may also be provided to the general interconnect structure for shift register chaining, via output select multiplexer 1811D and CLE output terminal DMUX. Accordingly, the circuits and methods set forth above may be implemented in a device such as the devices of FIGS. 17 and 18, or any other suitable device.

It can therefore be appreciated that new circuits for and methods of reducing duty-cycle distortion in an integrated circuit implementing dual-edge clocking has been described. It will be appreciated by those skilled in the art that numerous alternatives and equivalents will be seen to exist that incorporate the disclosed invention. As a result, the invention is not to be limited by the foregoing embodiments, but only by the following claims.

We claim:

1. A circuit for reducing duty-cycle distortion in an integrated circuit implementing dual-edge clocking, the circuit comprising:
 a plurality of circuit elements that enable the routing of data generated at outputs of the circuit elements;
 a plurality of register circuits that store data at outputs of the plurality of circuit elements;
 a clock circuit routing a clock signal to clock inputs of the plurality of register circuits; and
 a pulsed-controlled register circuit coupled to an output of a circuit element and generating a pulsed output coupled to a clock input of a register of the pulse-controlled register circuit;
 wherein the pulsed output is coupled to the clock input of the register to enable the pulse-controlled register circuit to store data at a time that is different than an edge of the clock signal.

2. The circuit of claim 1 wherein the plurality of register circuits comprises a plurality of pulse-controlled latch circuits.

3. The circuit of claim 2 wherein the plurality of pulse-controlled latch circuits are selectively implemented in critical paths of a circuit design that receives the clock signal having duty-cycle distortion.

4. The circuit of claim 1 wherein the plurality of register circuits comprises a plurality of programmable latch circuits.

5. The circuit of claim 1 further comprising programmable interconnect elements, wherein the pulse-controlled register circuit is coupled, using the programmable interconnect elements, to an output of the circuit element in a critical path of a circuit design receiving a clock signal having duty-cycle distortion.

6. The circuit of claim 1 wherein the pulse-controlled register circuit comprises a portion of a programmable flip-flop.

7. The circuit of claim 1 wherein the pulse-controlled register circuit comprises a programmable latch circuit that is programmable to generate pulsed outputs on either rising edges of the clock signal or both rising and falling edges of the clock signal.

8. A method of reducing duty-cycle distortion in an integrated circuit implementing dual-edge clocking, the method comprising:
 implementing a plurality of circuit elements to enable routing of data between the circuit elements;
 implementing a plurality of register circuits to store output data generated at outputs of the circuit elements;
 routing a clock signal to clock inputs of the plurality of register circuits;
 identifying duty-cycle distortion in the clock signal at a clock input of a register of a pulse-controlled register circuit; and
 coupling a pulsed output to the clock input of the register of the pulse-controlled register circuit;
 wherein the pulsed output is coupled to the clock input of the register to enable the pulse-controlled register circuit to store data at a time that is different than an edge of the clock signal.

9. The method of claim 8 wherein routing a clock signal to clock inputs of a plurality of register circuits comprises routing a clock signal to a plurality of latch circuits.

10. The method of claim 8 wherein the pulse-controlled register circuit is coupled to an output of a first circuit element.

11. The method of claim 10 further comprising identifying a duty-cycle distortion in the clock signal at a clock input of a second register circuit coupled to an output of the second circuit element.

12. The method of claim 11 further comprising determining whether a data path between the second circuit element and a third circuit element is a critical path, and implementing the second register circuit as a pulse-controlled register if the data path between the second circuit element and the third circuit element is determined to be a critical path.

13. The method of claim 8 further comprising identifying critical paths in a circuit design implementing the plurality of circuit elements.

14. The method of claim 13 further comprising selectively implementing pulse-controlled register circuits in the identified critical paths of the circuit design that receive the clock signal having duty-cycle distortion.

15. A circuit for reducing duty-cycle distortion in an integrated circuit implementing dual-edge clocking, the circuit comprising:
 means for routing data generated at outputs of a plurality of circuit elements;
 means for storing data generated at the outputs of the plurality of circuit elements at a plurality of register circuits;
 means for routing a clock signal to clock inputs of the plurality of register circuits; and
 a pulsed-controlled register means coupled to an output of a circuit element and generating a pulsed output coupled to a clock input of a register of the pulse-controlled register means;
 wherein the pulsed output is coupled to the clock input of the register to enable the pulse-controlled register means to store data at a time that is different than an edge of the clock signal.

16. The circuit of claim 15 further comprising a plurality of pulse-controlled register means selectively implemented in critical paths of a circuit design that receives the clock signal having duty-cycle distortion.

17. The circuit of claim 15 wherein the plurality of register circuits comprises programmable latch circuits.

18. The circuit of claim 15 further comprising programmable interconnect means, wherein the pulse-controlled register means is coupled, using the programmable interconnect means, to an output of a circuit element in a critical path of a circuit design receiving the clock signal having duty-cycle distortion.

19. The circuit of claim 15 wherein the pulse-controlled register means comprises a portion of a programmable flip-flop.

20. The circuit of claim 15 wherein the pulse-controlled register means comprises a programmable latch circuit that is programmable to generate pulsed outputs on either rising edges of the clock signal or both rising and falling edges of the clock signal.

* * * * *